(12) United States Patent
Shinagawa

(10) Patent No.: US 8,755,230 B2
(45) Date of Patent: Jun. 17, 2014

(54) SEMICONDUCTOR MEMORY DEVICE

(75) Inventor: Yuichi Shinagawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 340 days.

(21) Appl. No.: 13/358,113

(22) Filed: Jan. 25, 2012

(65) Prior Publication Data

US 2012/0243321 A1    Sep. 27, 2012

(30) Foreign Application Priority Data

Mar. 24, 2011 (JP) ................... 2011-066711

(51) Int. Cl.
*G11C 11/34* (2006.01)
*G11C 16/04* (2006.01)

(52) U.S. Cl.
USPC ............ 365/185.18; 365/185.24; 365/201

(58) Field of Classification Search
USPC ............... 365/185.18, 185.24, 201
See application file for complete search history.

(56) References Cited

U.S. PATENT DOCUMENTS

| 6,643,180 B2 * | 11/2003 | Ikehashi et al. | 365/185.22 |
| 6,851,018 B2 * | 2/2005 | Wyatt et al. | 711/111 |
| 2006/0253644 A1 * | 11/2006 | Surico et al. | 711/103 |
| 2008/0123410 A1 * | 5/2008 | Shirakawa et al. | 365/185.03 |

FOREIGN PATENT DOCUMENTS

| JP | 2002-117699 | 4/2002 |
| JP | 2003-110034 | 4/2003 |
| JP | 2007-164865 | 6/2007 |
| JP | 2009-32313 | 2/2009 |
| JP | 2009-259329 | 11/2009 |

* cited by examiner

*Primary Examiner* — Toan Le
(74) *Attorney, Agent, or Firm* — Oblon, Spivak, McClelland, Maier & Neustadt, L.L.P.

(57) ABSTRACT

According to one embodiment, there is provided a semiconductor memory device including a memory cell array, a storage unit, a selection unit, a startup processing unit, and an operation control unit. The memory cell array includes memory cells. The storage unit stores a plurality of operating parameters. The selection unit accesses the storage unit and selects a first operating parameter for operating the memory cells from among the plurality of operating parameters stored in the storage unit, based on a first instruction input. The startup processing unit performs a power startup and reads out the first operating parameter from the storage unit and sets the first operating parameter so as to be ready for use, based on a second instruction input. The operation control unit uses the first operating parameter set by the startup processing unit in order to operate the memory cells.

19 Claims, 8 Drawing Sheets

○ ENTER TEST MODE

○ READ OUT DATA FROM OPERATING PARAMETER TO BE CHANGED
5Ah(COM)-Beh(COM)-Add(ADDRESS)

○ DATA FROM OPERATING PARAMETER TO BE CHANGED IS TRANSFERRED TO CACHE

○ TRANSFER DATA IN CACHE TO REGISTER

○ CONTENT IN REGISTER IS REWRITTEN AND OPERATE BY CHANGED OPERATING PARAMETER

ACTUAL LINE:
STATE WHERE RELIABILITY IS DETERIORATED BECAUSE Vth
DISTRIBUTION WIDTH IS WIDENED AFTER W/E
BROKEN LINE:
Vth DISTRIBUTION AFTER OPERATING PARAMETERS ARE CHANGED
IN ORDER TO IMPROVE RELIABILITY FROM STATE AFTER W/E

SEMICONDUCTOR MEMORY DEVICE

CROSS-REFERENCE TO RELATED APPLICATIONS

This application is based upon and claims the benefit of priority from Japanese Patent Application No. 2011-066711, filed on Mar. 24, 2011; the entire contents of which are incorporated herein by reference.

FIELD

Embodiments described herein relate generally to a semiconductor memory device.

BACKGROUND

In a conventional NAND flash memory, adjustments are made to the operating parameters of the memory cells during the inspection process prior to shipment for when there is a variety of performance requirements from the user. However, the user may sometimes wish to alter the operational characteristics of the memory cells in a NAND flash memory after shipment.

DETAILED DESCRIPTION

In general, according to one embodiment, there is provided a semiconductor memory device including a memory cell array, a storage unit, a selection unit, a startup processing unit, and an operation control unit. The memory cell array includes memory cells. The storage unit stores a plurality of operating parameters. The selection unit accesses the storage unit and selects a first operating parameter for operating the memory cells from among the plurality of operating parameters stored in the storage unit, based on a first instruction input. The startup processing unit performs a power startup and reads out the first operating parameter from the storage unit and sets the first operating parameter so as to be ready for use, based on a second instruction input. The operation control unit uses the first operating parameter set by the startup processing unit in order to operate the memory cells.

Exemplary embodiments of a semiconductor memory device will be explained below in detail with reference to the accompanying drawings. The present invention is not limited to the following embodiments.

First Embodiment

Figures 1, 2:
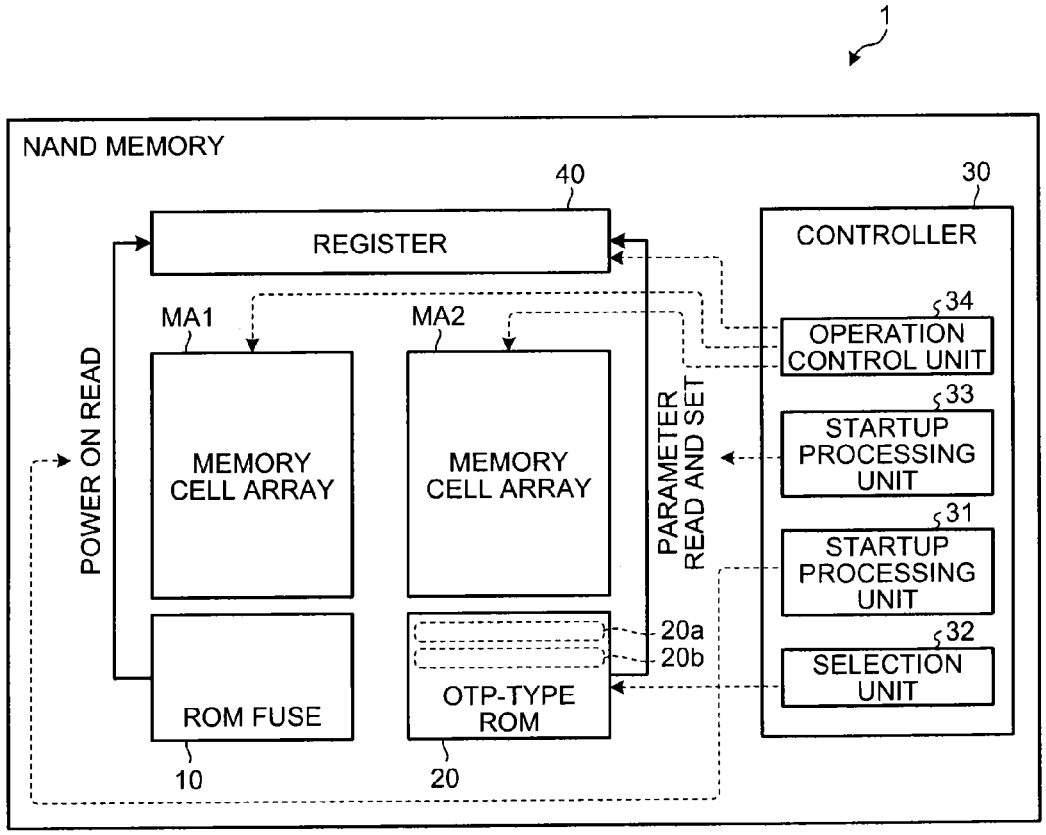
FIG. 1 is a diagram illustrating a configuration of a semiconductor memory device according to a first embodiment.
FIG. 2 is a diagram illustrating a readout command sequence in the first embodiment.

A description is provided for the semiconductor memory device according to the first embodiment using FIG. 1. FIG. 1 is a diagram illustrating the configuration of the semiconductor memory device.

The semiconductor memory device is a nonvolatile semiconductor memory, including, for example, a NAND flash memory (hereinafter called NAND memory) 1. The following is an exemplary description of when the semiconductor memory device is a NAND memory 1.

The NAND memory 1 includes memory cell arrays MA1 and MA2; an ROM fuse 10; an OTP (One Time Programmable)-type ROM 20; a controller 30; and a register 40.

In each of memory cell arrays MA1 and MA2, a plurality of memory cells are arranged in, for example, row and column directions. In the memory cell arrays MA1 and MA2, the memory cells are selected and operated by a selected word line in a plurality of word lines extending in the row direction and a selected bit line in a plurality of bit lines extending in the column direction. Multi-value storage in each memory cell is possible by using an upper page and a lower page. The memory cell arrays MA1 and MA2 are configured by arranging a plurality of physical blocks, which are units of data erasure. In the memory cell arrays MA1 and MA2, both programming and reading out of data are carried out on each physical page. A physical block is constituted of a plurality of physical pages.

Initial operating parameters are previously stored in the ROM fuse 10 prior to shipment. The initial operating parameters are parameters that relate to the operating conditions of each memory cell that have been decided prior to shipment as suited to the initialized state (at the time of shipping) of each memory cell. Initial operating parameters include, for example, (a set of) the following parameters.

(1) During programming (prog)
    start Vpgm: first applied program voltage
    $\Delta$Vpgm: step size of program voltage
    pulse width: pulse width of program voltage
    Program Verify level: verify voltage during programming
    Unselected WL (WordLine) Voltage: voltage applied to a word line that has not been selected during programming (2) During reading (read)
    Vread: voltage applied to a word line that has not been selected during reading out
    Tsense: sense time during reading out
    Tblch: time to charge a selected BL (Bit Line) (the BL charge time)
    read level: readout voltage to determine the memory cell threshold (3) During erasure (Erase)
    start Vera: first applied erase voltage
    $\Delta$Vera: step size of erase voltage
    pulse width of erase voltage Vera: pulse width of erase voltage
    Erase Verify level: verify voltage during erasure The OTP-type ROM 20 is arranged on the periphery of the memory cell arrays MA1 and MA2. The OTP-type ROM 20 is an ROM region having OTP functions. In other words, the OTP-type ROM 20 is configured so as to reject erase commands, and one-time programmed data on the OTP-type ROM 20 is made so as to not be erasable.

In the OTP-type ROM 20, a plurality of operating parameters are previously stored prior to shipment as candidates to be selected by selection unit 32, described below. The plurality of operating parameters include, for example, parameters relating to the operating conditions of each memory cell that have been decided prior to shipment as corresponding to a plurality of levels of states of deterioration over time of each memory cell after shipment. The plurality of respective operating parameters include, for example, parameters having values that have shifted from the value of the initial operating parameter for similar items to the initial operating parameters described above.

The plurality of operating parameters include, for example, program voltages Vpgm1 and Vpgm2, which have lower values than the program voltage Vpgm of the initial operating parameters. The plurality of operating parameters include, for example, erase voltages Vera 1 and Vera 2, which have higher values than the erase voltage Vera of the initial operating parameters. The plurality of operating parameters include, for example, sense times Tsense1 and Tsense2, which have longer values than the sense time Tsense of the initial operating parameters. The plurality of operating parameters include, for example, BL charge times Tblch1 and Tblch2, which have longer values than the BL charge time Tblch of the initial operating parameters.

The controller 30 controls the operation of each unit in the NAND memory 1. More specifically, the controller 30 includes a startup processing unit 31, a selection unit 32, a startup processing unit 33, and an operation control unit 34.

Figure 10:
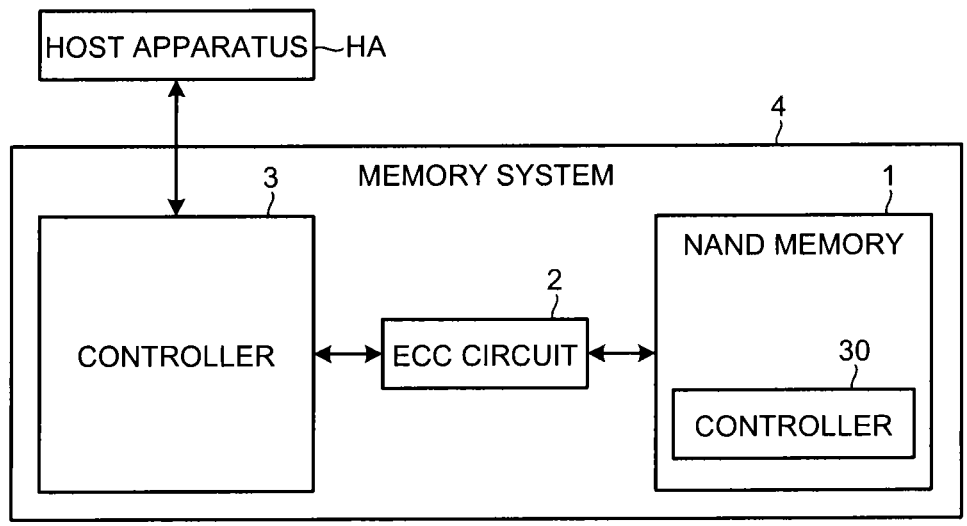
FIG. 10 is a diagram illustrating a configuration of a memory system in which the semiconductor memory devices according to the first through fourth embodiments have been applied.

The startup processing unit 31 receives from outside (for example, a controller 3 as illustrated in FIG. 10) a power startup command and first readout command generated in reaction to a startup instruction "Power On Read" from the user. The startup processing unit 31 starts up a power circuit (not illustrated) in the NAND memory 1 according to the power startup command. The startup processing unit 31, after recognizing that the startup of the power circuit is completed, reads out the initial operating parameters stored in the ROM fuse 10 according to the first readout command for transfer to and storage in the register 40. The initial operating parameters are thereby set so as to be ready for use.

The startup processing unit 31 also receives from outside (for example, the controller 3 as illustrated in FIG. 10) a first readout command generated in reaction to a startup instruction "Parameter read and set" from the user. The startup processing unit 31, after recognizing that the startup of the power circuit is completed, reads out the initial operating parameters stored in the ROM fuse 10 according to the first readout command for transfer to and storage in the register 40. The initial operating parameters are thereby set so as to be ready for use.

The selection unit 32 receives from outside a change command generated in reaction to a change instruction from the user. The selection unit 32 selects the operating parameter to be used in order to operate each memory cell from among the plurality of operating parameters stored in the OTP-type ROM 20, according to the change command (change order). Specifically, the selection unit 32 accesses the OTP-type ROM 20 and recognizes the plurality of operating parameters and the addresses thereof stored in the OTP-type ROM 20, selects from among the plurality of operating parameters the one that corresponds to the change instruction from the user, and retains the address of the selected operating parameter.

The startup processing unit 33 receives from outside a power startup command and a second readout command generated in reaction to a startup instruction "Parameter read and set" from the user. The startup processing unit 33 starts up a power circuit (not illustrated) in the NAND memory 1 according to the power startup command. The startup processing unit 33, after recognizing that the startup of the power circuit is completed, reads out from the OTP-type ROM 20 the operating parameter that has been selected by the selection unit 32, according to the second readout command. That is to say, the startup processing unit 33 accesses the address in the OTP-type ROM 20 retained by the selection unit 32 and reads out the operating parameter, according to the second readout command. The startup processing unit 33 transfers to and stores the readout operating parameter in the register 40. The readout operating parameter is thereby set so as to be ready for use.

The operation control unit 34 recognizes the operating parameter that is to be used in order to operate each memory cell by accessing the register 40. The operation control unit 34 uses the recognized operating parameter in order to have each memory cell in the memory cell arrays MA1 and MA2 conduct program operations, readout operations, and erase operations. That is, the operation control unit 34 utilizes the operating parameter that has been set so as to be ready for use by the startup processing unit 33 in order to operate each memory cell.

Next, a description will be provided for the sequence of second readout commands using FIG. 2. FIG. 2 is a diagram illustrating the sequence of the second readout commands.

The startup processing unit 33, after recognizing that the startup of the power circuit is completed, places the operating mode of the NAND memory 1 in a test mode. The startup processing unit 33 inputs a command "5Ah" indicating the readout, a command "BEh," and an address "Add" in order to execute readout process to read out the operating parameter from the OTP-type ROM 20. The startup processing unit 33 transfers the data from the readout operating parameter to a cache memory (not illustrated) in the controller 30 for temporary storage therein. Further, the startup processing unit 33 transfers the data from the operating parameter temporarily stored in the cache memory to the register 40, and then overwrites the initial operating parameters already stored in the register 40 with the transferred operating parameter.

The operating parameter in the register 40 is thereby rewritten. For example, when initial operating parameters have already been stored in the register 40 according to a first readout command executed previously, the operating parameter to be utilized to operate each memory cell retained in the register 40 is rewritten from the initial operating parameters to the operating parameter described above.

Figure 3:
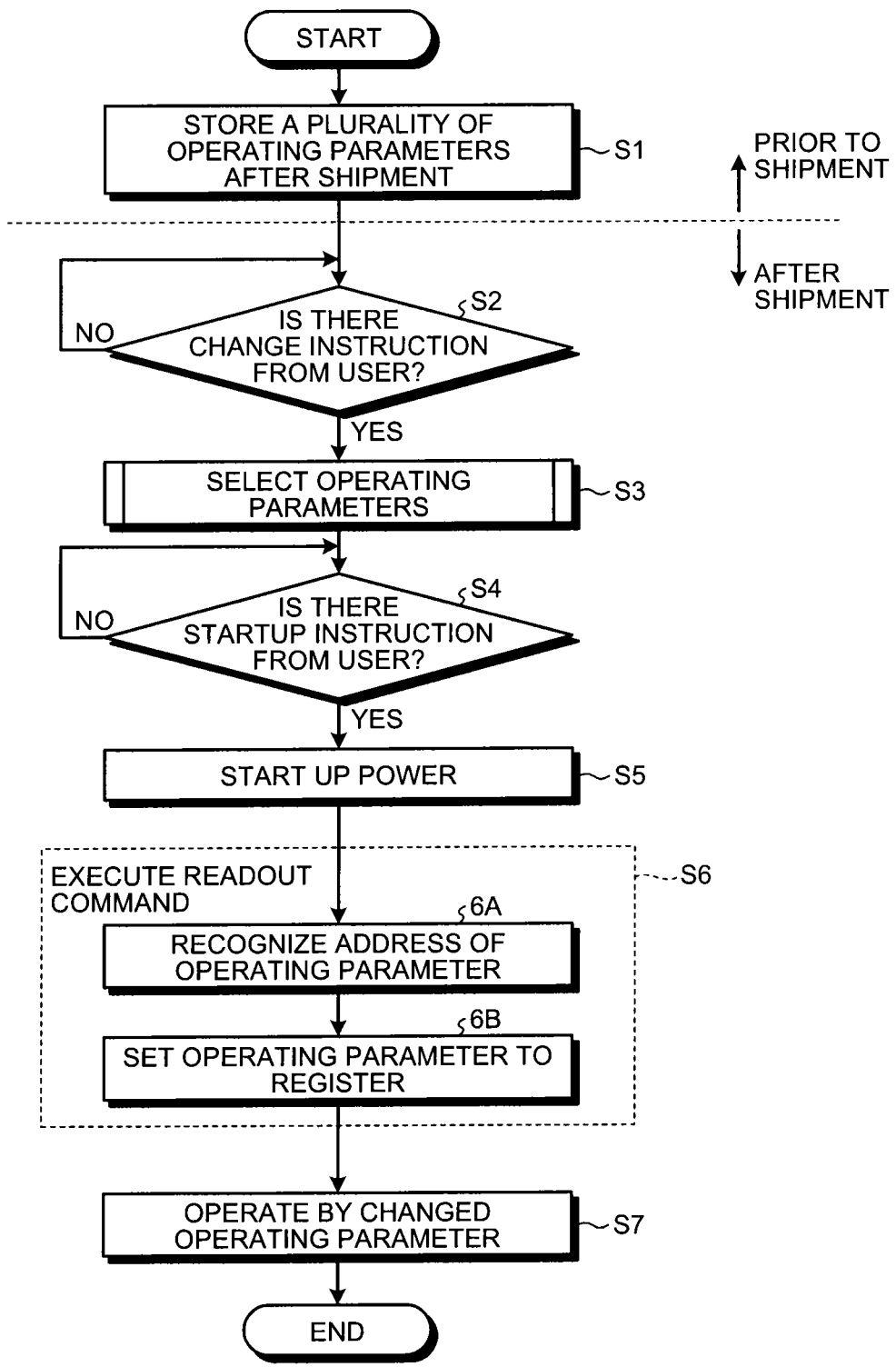
FIG. 3 is a flowchart illustrating an operation of the semiconductor memory device in the first embodiment.

Next, a description will be provided for the operation of the NAND memory 1 using FIG. 3. FIG. 3 is a flowchart illustrating the operation of the NAND memory 1.

Of the processes illustrated in FIG. 3, the process of step S1 is performed prior to shipment of the NAND memory 1, and the processes starting from step S2 are performed after shipment of the NAND memory 1.

In step S1, initial operating parameters are stored in the ROM fuse 10. Also, a plurality of operating parameters are stored in the OTP-type ROM 20 as candidates to be selected by the selection unit 32. That is, prior to shipment, the expected states of deterioration over time of each memory cell after shipment are ranked in a plurality of levels, and values that have shifted from the values of the initial operating parameters are decided according to the respective levels. In this manner, a plurality of operating parameters OP1 and OP2 having values that have shifted are stored in the OTP-type ROM 20.

In step S2, the selection unit 32 determines whether or not a change command generated in reaction to a change instruction from the user has been received from outside. The selection unit 32 returns the process to step S2 when no change command is received (NO in step S2), and advances the process to step S3 when the change command has been received (YES in step S2).

In step S3, the selection unit 32 selects the operating parameter to be utilized in order to operate each memory cell from among the plurality of operating parameters stored in the OTP-type ROM 20. Specifically, the selection unit 32 accesses the OTP-type ROM 20 and recognizes a plurality of operating parameters stored in the OTP-type ROM 20 and the addresses "Add" thereof, selects from among the plurality of operating parameters the one corresponding to the change instruction from the user, and retains the address "Add" of the selected operating parameter.

In step S4, the startup processing unit 33 determines whether or not a power startup command and a second readout command generated in reaction to a startup instruction "Parameter read and set" from the user have been received from outside. The startup processing unit 33 returns the process to step S4 when no power startup command and second readout command are received (NO in step S4), and advances the process to step S5 when the power startup command and the second readout command have been received (YES in step S4).

In step S5, the startup processing unit 33 starts up a power circuit (not illustrated) in the NAND memory 1 according to the power startup command. Further, the startup processing unit 33 recognizes that the startup of the power circuit is completed by monitoring the levels of, for example, a power line (not illustrated) in the NAND memory 1. The startup processing unit 33, after recognizing that the startup of the power circuit is completed, advances the process to step S6.

In step S6, the startup processing unit 31 receives from outside (for example, the controller 3 as illustrated in FIG. 10) a first readout command generated in reaction to a startup instruction "Parameter read and set" from the user. The startup processing unit 31, after recognizing that the startup of the power circuit is completed, reads out the initial operating parameters stored in the ROM fuse 10 according to the first readout command for transfer to and storage in the register 40. The initial operating parameters are thereby set so as to be ready for use.

Further, the startup processing unit 33 reads out from the OTP-type ROM 20 the operating parameter selected by the selection unit 32 according to the second readout command. Specifically, steps S6A and S68 are processed as follows.

In step S6A, the startup processing unit 33 receives from the selection unit 32 the address "Add" of the selected operating parameter according to the second readout command. The startup processing unit 33 thereby recognizes the address "Add" of the selected operating parameter.

In step S6B, the startup processing unit 33 reads out from the OTP-type ROM 20 the operating parameter selected by the selection unit 32 according to the second readout command. That is, the startup processing unit 33 reads out the operating parameter by accessing the address "Add" in the OTP-type ROM 20 retained by the selection unit 32, according to the second readout command. For example, the startup processing unit 33 reads out an operating parameter OP1 by accessing the address of a storage region 20a in the OTP-type ROM 20. Alternatively, for example, the startup processing unit 33 reads out an operating parameter OP2 by accessing the address of a storage region 20b in the OTP-type ROM 20. The startup processing unit 33 transfers the readout operating parameter to the register 40 and then overwrites the initial operating parameters already stored in the register 40 with the transferred operating parameter for storage therein. The readout operating parameter is thereby set so as to be ready for use.

In step S7, the operation control unit 34 accesses the register 40 in order to recognize the operating parameter (that is, the operating parameter after the change) that is to be utilized to operate each memory cell. The operation control unit 34 uses the recognized operating parameter in order to have each memory cell in the memory cell arrays MA1 and MA2 conduct program operations, readout operations, and erase operations. That is, the operation control unit 34 utilizes the operating parameter that has been set so as to be ready for use by the startup processing unit 33 in order to operate each memory cell.

Figure 4:
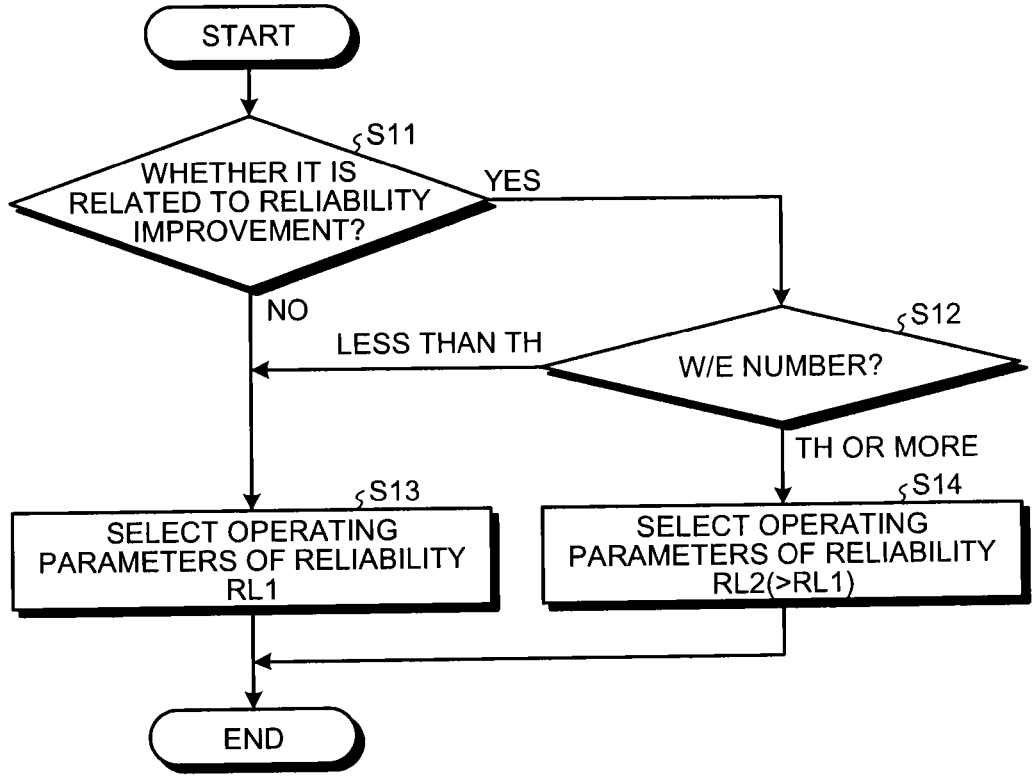
FIG. 4 is a flowchart illustrating the operation of the semiconductor memory device in the first embodiment.

Next, a detailed description will be provided for the process (step S3) for selecting the operating parameter using FIG. 4. FIG. 4 is a flowchart illustrating the process flow in the process (step S3) for selecting the operating parameter.

In step S11, the selection unit 32 receives from outside a change command generated in reaction to a change instruction from the user. The selection unit 32 determines whether or not the content of the change instruction from the user relates to a reliability improvement, based on the content of the change command. The selection unit 32 advances the process to step S12 when there is one related to a reliability improvement (YES in step S11), and advances the process to step S13 when there is not one related to a reliability improvement (NO in step S11).

In step S12, the selection unit 32 receives from outside (for example, the controller 3 illustrated in FIG. 10) information on the number of writes/erasures. The number of writes/erasures is, for example, an average value of physical block units taking the average of the validation data for multiple physical blocks. The selection unit 32 determines whether or not the number of writes/erasures is equal to or more than the threshold TH. The selection unit 32 advances the process to step S13 when the number of writes/erasures is less than the threshold TH ("LESS THAN TH" in step S12), and advances the process to step S14 when the number of writes/erasures is equal to or more than the threshold TH ("TH OR MORE" in step S12).

In step S13, the selection unit 32 selects the operating parameter OP1 of a reliability RL1 from among the plurality of operating parameters stored in the OTP-type ROM 20. The operating parameter OP1 is a parameter that has been predetermined to improve reliability over that of the initial operating parameter.

The operating parameter OP1 includes, for example, the program voltage Vpgm1 having a lower value than the program voltage Vpgm of the initial operating parameter. The operating parameter OP1 includes, for example, the erase voltage Vera1 having a higher value than the erase voltage Vera of the initial operating parameter. The operating parameter OP1 includes, for example, the sense time Tsense1 having a longer value than the sense time Tsense of the initial operating parameter. The operating parameter OP1 includes, for example, the BL charge time Tblch1 having a longer value than the BL charge time Tblch of the initial operating parameter.

In step S14, the selection unit 32 selects an operating parameter OP2 of a reliability RL2 (>RL1) from among the plurality of operating parameters stored in the OTP-type ROM 20. That is, the selection unit 32 selects the operating parameter OP2 of the reliability RL2 (>RL1) by recognizing when the level of a reliability should be improved up to the reliability RL2 higher than that in step S13 after having determined that the number of writes/erasures in step S12 is equal to or more than the threshold TH. The operating parameter OP2 is a parameter that has been predetermined to have improved reliability over both the initial operating parameter and the operating parameter OP1.

The operating parameter OP2 includes, for example, the program voltage Vpgm2, which has a lower value than the program voltage Vpgm of the initial operating parameter and a lower value than the program voltage Vpgm1 described above. The operating parameter OP2 includes, for example, the erase voltage Vera2, which has a higher value than the erase voltage Vera of the initial operating parameters and a higher value than the erase voltage Vera1 described above. The operating parameter OP2 includes, for example, the Tsense2, which has a longer value than the sense time Tsense of the initial operating parameter and a longer value than the sense time Tsense1 described above. The operating parameter OP2 includes, for example, the BL charge time Tblch2, which has a longer value than the BL charge time Tblch of the initial operating parameter and a longer value than the BL charge time Tblch1 described above.

As described above, in the first embodiment, data from a plurality of operating parameters different from the ROM fuse 10 are previously programmed into the OTP-type ROM 20, and the operating parameter to be utilized in order to operate each memory cell is selected from among the plurality of operating parameters in reaction to a change instruction from the user. Further, the above-described operating parameter selected in reaction to the startup instruction "Parameter read and set" from the user is read out from the OTP-type ROM 20 and set in the register 40, and each memory cell is operated with this established operating parameter. The operation characteristics of the memory cells can thereby be changed after shipment.

Also, in the first embodiment, because the operating parameter corresponding to the change instruction from the user is selected automatically, the operation characteristics of the memory cells can be changed by a simple operation, without requiring sophisticated knowledge of the operating parameter values. That is, the user is able to raise the reliability of the NAND memory 1 by carrying out a simple operation.

Also, in the first embodiment, the OTP-type ROM 20 is arranged around the memory cell arrays MA1 and MA2. Consumption of the memory cell arrays MA1 and MA2 can thereby be suppressed. Also, because it is easy to configure the OTP-type ROM 20 so as to not receive erase commands, accidental erasure of the plurality of operating parameters stored in the OTP-type ROM 20 by the user can be avoided.

Moreover, in the first embodiment, the plurality of operating parameters stored previously in the OTP-type ROM 20 includes, for example, parameters relating to the operating conditions of each memory cell decided prior to shipment as corresponding to a plurality of levels of states of deterioration over time of each memory cell after shipment. Thereby, the reliability of the NAND memory 1 can be enhanced in a multi-stage manner in reaction to the change instruction from the user and to the levels of states of deterioration over time of each memory cell after shipment.

Figure 5:
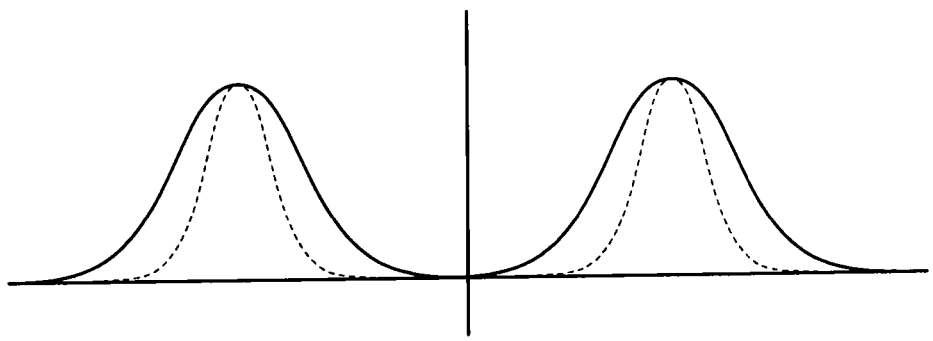
FIG. 5 is a diagram illustrating the effects by the first embodiment.

Specifically, as illustrated in FIG. 4, although the requested level of reliability improvement is not as high when the change instruction from the user is not one that relates to a reliability improvement, this does not mean that the user is satisfied with the present reliability, and the operating parameter OP1 of the reliability RL1 is selected in order to improve reliability to a certain extent from the present situation. Also, even when the change instruction from the user relates to a reliability improvement, when the number of writes/erasures is less than the threshold TH, then even though the requested level of reliability improvement is high, the need for reliability improvement is not so high in consideration of the state of deterioration of each memory cell, and thus the operating parameter OP1 of the reliability RL1 is selected in order to improve reliability to a certain extent from the present situation. Furthermore, when the change instruction from the user relates to reliability improvement and the number of writes/erasures is equal to or more than the threshold TH, then the requested level of reliability improvement is high and the need for reliability improvement in consideration of the state of deterioration of each memory cell is also high, and thus the operating parameter OP2 of the reliability RL2 is selected in order to greatly improve reliability from the present situation. Thereby, the reliability of the NAND memory 1 can be enhanced in a multi-stage manner in reaction to the change instruction from the user and to the levels of states of deterioration over time of each memory cell after shipment (see FIG. 5).

It is noted that the plurality of operating parameters serving as candidates for selection by the selection unit 32 may be stored in an ROM region within the memory cell arrays MA1 and MA2 that has been set to not receive erase commands, instead of being stored in the OTP-type ROM 20.

Additionally, when the NAND memory 1 is aimed at high reliability, then the process (step S3) for selecting operating parameters may serve to allow step S11 of FIG. 4 to be omitted. That is, the process of step S12 of FIG. 4 may be performed regardless of the content of the change instruction from the user. Thereby, the reliability in the NAND memory 1 that is aimed at high reliability can be raised by selecting the operating parameters required depending on the number of W/E for use in operating the memory cells.

Second Embodiment

Figure 6:
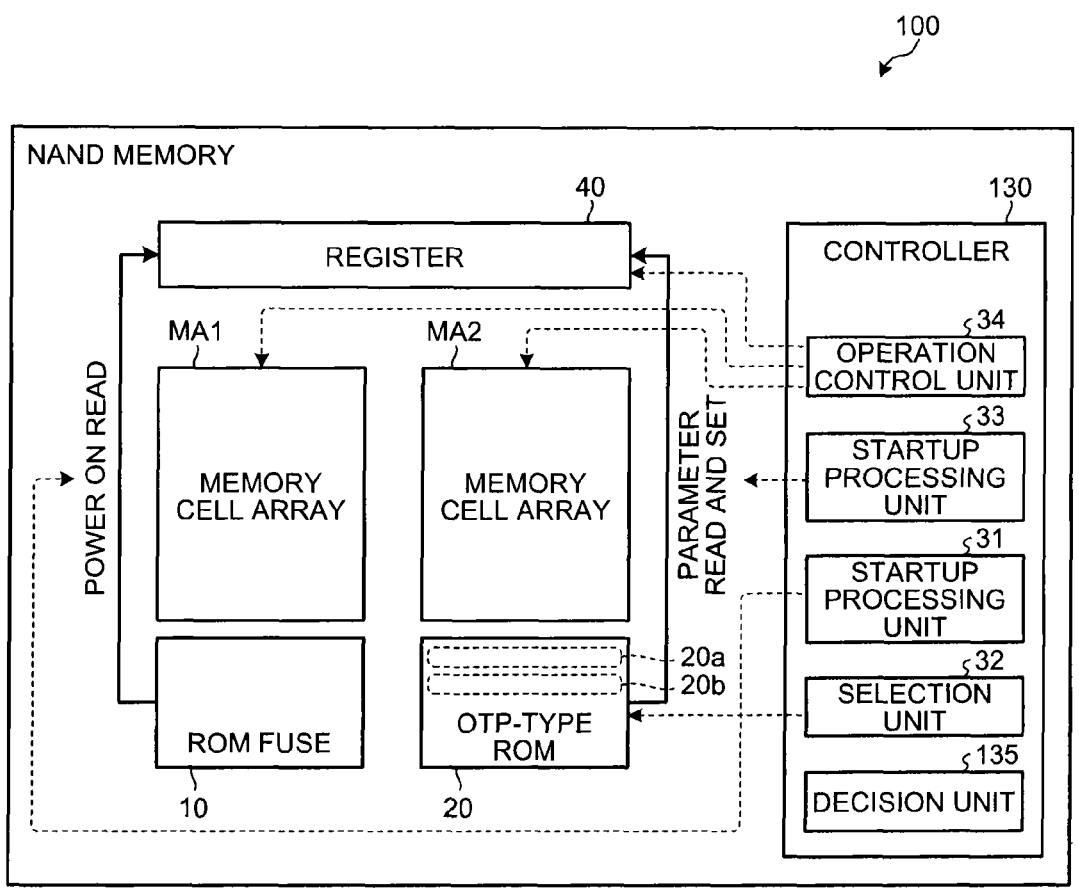
FIG. 6 is a diagram illustrating a configuration of the semiconductor memory device according to a second embodiment.

Next, a description is provided for the semiconductor memory device according to the second embodiment using FIG. 6. FIG. 6 is a diagram illustrating the configuration of the semiconductor memory device. The description below focuses on those components that differ from the first embodiment.

A NAND memory 100 acting as the semiconductor memory device according to the second embodiment includes a plurality of operating modes "A mode" to "E mode," which include an operating mode "B mode" that gives priority to reliability and an operating mode "C mode" that gives priority to performance. The NAND memory 100 includes a controller 130. The controller 130 has a decision unit 135.

The decision unit 135 receives from outside change commands generated in reaction to a change instruction from the user. The decision unit 135 decides an operating mode depending on the change instruction from the user from among the plurality of operating modes "A mode" to "E mode" of the NAND memory 100 according to the change commands.

The selection unit 32 selects the operating parameter to be utilized in order to operate each memory cell depending on the operating mode decided in reaction to the change instruction from the user. The selection unit 32 selects from among the plurality of operating parameters the one that corresponds to the operating mode, and retains the address of the selected operating parameter.

Figure 7:
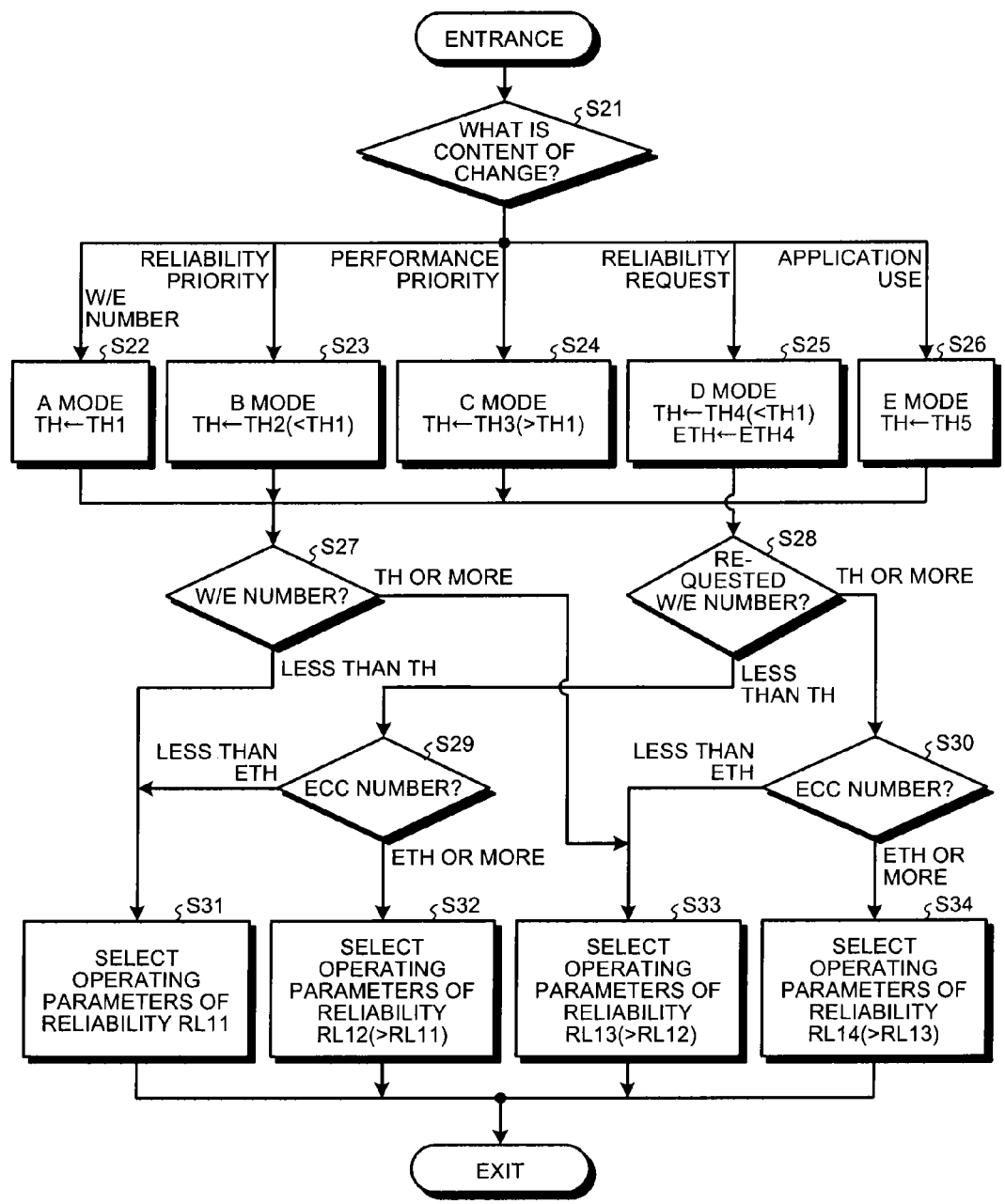
FIG. 7 is a flowchart illustrating an operation of the semiconductor memory device in the second embodiment.

In addition, as illustrated in FIG. 7, the details of the process (step S3) for selecting the operating parameters differ from the first embodiment. FIG. 7 is a flowchart illustrating the process flow in the process (step S3) for selecting the operating parameters.

In step S21, the decision unit 135 receives from outside a change command generated in reaction to a change instruction from the user. The decision unit 135 determines what the content of the change instruction from the user relates to, based on the content of the change command. The decision unit 135 advances the process to step S22 when the content of the change instruction from the user relates to raising reliability, according to the number of writes/erasures ("W/E NUMBER" in step S21). The decision unit 135 advances the process to step S23 when the content of the change instruction from the user sacrifices performance (readout processing time tR/program processing time tPROG/erase processing time tERASE) in order to raise reliability ("RELIABILITY PRIORITY" in step S21). The decision unit 135 advances the process to step S24 when the content of the change instruction from the user sacrifices reliability in order to raise performance ("PERFORMANCE PRIORITY" in step S21). The decision unit 135 advances the process to step S25 when the content of the change instruction from the user relates to a reliability request (requested W/E number, ECC number) ("RELIABILITY REQUEST" in step S21). The decision unit 135 advances the process to step S26 when the content of the change instruction from the user relates to using an application use ("APPLICATION USE" in step S21).

In step S22, the decision unit 135 decides the operating mode of the NAND memory 100 as A mode. The decision unit 135 provides the selection unit 32 with information indicating that the operating mode is A mode. The selection unit 32 sets a threshold TH1 for A mode to the threshold TH for determining the number of writes/erasures in reaction to the fact that the operating mode is A mode. The threshold TH1 is, for example, a standardized threshold. Further, the selection unit 32 advances the process to step S27.

In step S23, the decision unit 135 decides the operating mode of the NAND memory 100 as B mode. The decision unit 135 provides the selection unit 32 with information indicating that the operating mode is B mode. The selection unit 32 sets a threshold TH2 (<TH1) for B mode to the threshold TH for determining the number of writes/erasures in reaction to the fact that the operating mode is B mode. The threshold TH2 is a threshold that has been lowered in contrast to the threshold TH1 such that reliability takes priority. Further, the selection unit 32 advances the process to step S27.

In step S24, the decision unit 135 decides the operating mode of the NAND memory 100 as C mode. The decision unit 135 provides the selection unit 32 with information indicating that the operating mode is C mode. The selection unit 32 sets a threshold TH3 (>TH1) for C mode to the threshold TH for determining the number of writes/erasures in reaction to the fact that the operating mode is C mode. The threshold TH3 is a threshold that has been raised in contrast to the threshold TH1 such that performance takes priority. Further, the selection unit 32 advances the process to step S27.

In step S25, the decision unit 135 decides the operating mode of the NAND memory 100 as D mode. The decision unit 135 provides the selection unit 32 with information indicating that the operating mode is D mode. The selection unit 32 sets a threshold TH4 (<TH1) for D mode to the threshold TH for determining the number of writes/erasures required in reaction to the fact that the operating mode is D mode. The threshold TH4 is a threshold that has been lowered in contrast to the threshold TH1 such that reliability takes priority. Additionally, the selection unit 32 sets a threshold ETH4 for D mode to a threshold ETH for determining the ECC (Error Checking and Correction) number (that is, the number of bits handled by ECC process) in reaction to the fact that the operating mode is D mode. Further, the selection unit 32 advances the process to step S28.

In step S26, the decision unit 135 decides the operating mode of the NAND memory 100 as E mode. The decision unit 135 provides the selection unit 32 with information indicating that the operating mode is E mode. The selection unit 32 sets a threshold TH5 for E mode to the threshold TH for determining the number of writes/erasures in reaction to the fact that the operating mode is E mode. The threshold TH5 is a threshold that has been changed for an application in contrast to the threshold TH1. Further, the selection unit 32 advances the process to step S27.

In step S27, the selection unit 32 receives from outside (for example, the controller 3 illustrated in FIG. 10) information on the number of writes/erasures. The selection unit 32 determines whether or not the number of writes/erasures is equal to or more than the threshold TH. The selection unit 32 advances the process to step S31 when the number of writes/erasures is less than the threshold TH ("LESS THAN TH" in step S27), and advances the process to step S33 when the number of writes/erasures is equal to or more than the threshold TH ("TH OR MORE" in step S27).

In step S28, the selection unit 32 receives from outside (for example, the controller 3 illustrated in FIG. 10) information on the requested number of writes/erasures. The selection unit 32 determines whether or not the requested number of writes/erasures is equal to or more than the threshold TH. The selection unit 32 advances the process to step S29 when the requested number of writes/erasures is less than the threshold TH ("LESS THAN TH" in step S28), and advances the process to step S30 when the number of writes/erasures is equal to or more than the threshold TH ("TH OR MORE" in step S28).

In step S29, the selection unit 32 receives from outside (for example, an ECC circuit 2 illustrated in FIG. 10) information on the ECC number. The selection unit 32 determines whether or not the ECC number is equal to or more than threshold ETH. The selection unit 32 advances the process to step S31 when the ECC number is less than the threshold ETH ("LESS THAN ETH" in step S29), and advances the process to step S32 when the ECC number is equal to or more than the threshold ETH ("ETH OR MORE" in step S29).

In step S30, the selection unit 32 receives from outside (for example, the ECC circuit 2 illustrated in FIG. 10) information on the ECC number. The selection unit 32 determines whether or not the ECC number is equal to or more than threshold ETH. The selection unit 32 advances the process to step S33 when the ECC number is less than the threshold ETH ("LESS THAN ETH" in step S30), and advances the process to step S34 when the ECC number is equal to or more than the threshold ETH ("ETH OR MORE" in step S30).

In step S31, the selection unit 32 selects an operating parameter OP11 of a reliability RL11 from among the plurality of operating parameters stored in the OTP-type ROM 20. The operating parameter OP11 is a parameter that has been predetermined to have lower reliability than, but also to be able to enhance performance from, the initial operating parameter.

The operating parameter OP11 includes, for example, a program voltage Vpgm11 having a higher value than the program voltage Vpgm of the initial operating parameters. The operating parameter OP11 includes, for example, an erase voltage Vera11 having a lower value than the erase voltage Vera of the initial operating parameters. The operating parameter OP11 includes, for example, a sense time Tsense11 having a shorter value than the sense time Tsense of the initial operating parameters. The operating parameter OP11 includes, for example, a BL charge time Tblch11 having a shorter value than the BL charge time Tblch of the initial operating parameters.

In step S32, the selection unit 32 selects an operating parameter OP12 of a reliability RL12 (>RL11) from among the plurality of operating parameters stored in the OTP-type ROM 20. The operating parameter OP12 is a parameter that has been predetermined to be able to enhance reliability over that of the initial operating parameters.

The operating parameter OP12 includes, for example, a program voltage Vpgm12 having a lower value than the program voltage Vpgm of the initial operating parameters. The operating parameter OP12 includes, for example, an erase voltage Vera12 having a higher value than the erase voltage Vera of the initial operating parameters. The operating parameter OP12 includes, for example, a sense time Tsense12 having a longer value than the sense time Tsense of the initial operating parameters. The operating parameter OP12 includes, for example, a BL charge time Tblch12 having a longer value than the BL charge time Tblch of the initial operating parameters.

In step S33, the selection unit 32 selects an operating parameter OP13 of a reliability RL13 (>RL12) from among the plurality of operating parameters stored in the OTP-type ROM 20. The operating parameter OP13 is a parameter that has been predetermined to be able to enhance reliability over those of both the initial operating parameters and the operating parameter OP12.

The operating parameter OP13 includes, for example, a program voltage Vrgm13 having a lower value than the program voltage Vpgm of the initial operating parameters, and also a lower value than the program voltage Vpgm12 described above. The operating parameter OP13 includes, for example, an erase voltage Vera13 having a higher value than the erase voltage Vera of the initial operating parameters, and also a higher value than the erase voltage Vera12 described above. The operating parameter OP13 includes, for example, a sense time Tsense13 having a longer value than the sense time Tsense of the initial operating parameters, and also a longer value than the sense time Tsense12 described above. The operating parameter OP13 includes, for example, a BL charge time Tblch13 having a longer value than the BL charge time Tblch of the initial operating parameters, and also a longer value than the BL charge time Tblch12 described above.

In step S34, the selection unit 32 selects an operating parameter OP14 of a reliability RL14 (>RL13) from among the plurality of operating parameters stored in the OTP-type ROM 20. The operating parameter OP14 is a parameter that has been predetermined to be able to enhance reliability over those of both the initial operating parameters and the operating parameters OP12 and OP13.

The operating parameter OP14 includes, for example, a program voltage Vpgm14 having a lower value than the program voltage Vpgm of the initial operating parameters, and also a lower value than the program voltages Vpgm12 and Vpgm13 described above. The operating parameter OP14 includes, for example, an erase voltage Vera14 having a higher value than the erase voltage Vera of the initial operating parameters, and also a higher value than the erase voltages Vera12 and Vera13 described above. The operating parameter OP14 includes, for example, a sense time Tsense14 having a longer value than the sense time Tsense of the initial operating parameters, and also a longer value than the sense times Tsense12 and Tsense13 described above. The operating parameter OP14 includes, for example, a BL charge time Tblch14 having a longer value than the BL charge time Tblch of the initial operating parameters, and also a longer value than the BL charge times Tblch12 and Tblch13 described above.

As described above, in the second embodiment, an operating mode is decided upon in reaction to a change instruction from the user from among a plurality of operating modes that include an operating mode giving priority to reliability and an operating mode giving priority to performance, and the operating parameter to be utilized in order to operate each memory cell is selected in reaction to the operating mode that has been decided upon. The reliability of the NAND memory 100 can thereby be enhanced in a multi-stage manner in reaction to a variety of change requests from the user.

Specifically, a variety of operating modes "A mode" to "E mode" are prepared to correspond to a variety of change requests from the user as operating modes of the NAND memory 100, such that the operating mode is automatically decided upon depending on the change instruction from the user. The operation characteristics of the memory cells can thereby be changed by a simple operation, without requiring sophisticated knowledge of the operating parameter values. That is, the user is able, for example, to improve the reliability of or improve the performance of the NAND memory 100 by performing a simple operation. In other words, the user can freely select a plurality of operating parameters corresponding to a plurality of operating modes of the NAND memory 100 according to application or objective.

Third Embodiment

Next, a description is provided for the semiconductor memory device according to the third embodiment. The description below focuses on those components that differ from the first embodiment.

Figure 8:
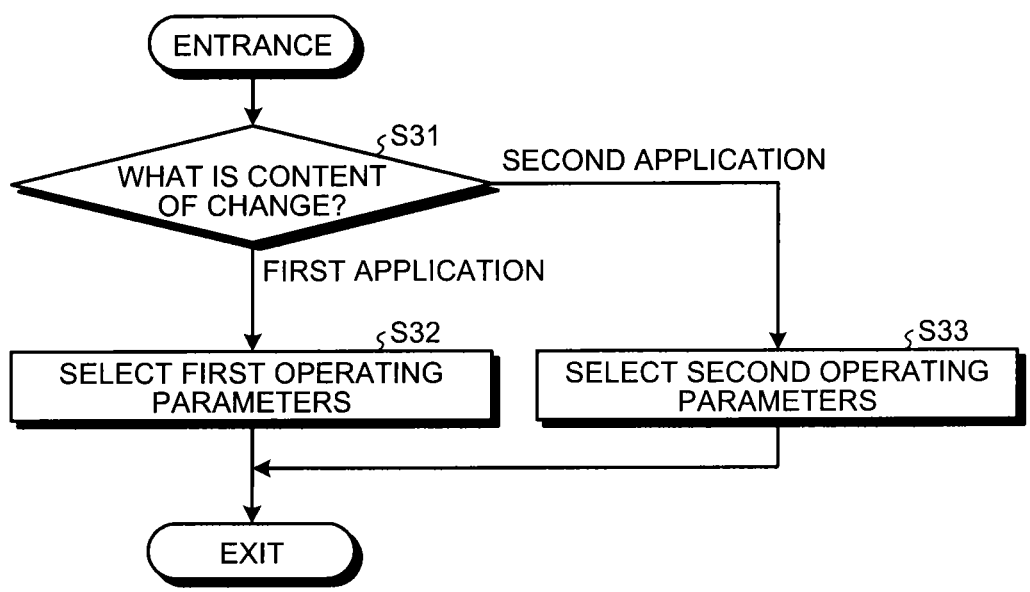
FIG. 8 is a flowchart illustrating an operation of the semiconductor memory device in a third embodiment.

The NAND memory 1 serving as the semiconductor memory device in the third embodiment differs from the first embodiment in the details of the process (step S3) for selecting operating parameters, as illustrated in FIG. 8. FIG. 8 is a flowchart illustrating the process flow in the process (step S3) for selecting operating parameters.

In step S31, the selection unit 32 receives from outside a change command generated in reaction to a change instruction from the user. The selection unit 32 determines what application the content of the change instruction from the user relates to, based on the content of the change command. The selection unit 32 advances the process to step S32 when the content of the change instruction from the user relates to a first application ("FIRST APPLICATION" in step S21). The selection unit 32 advances the process to step S33 when the content of the change instruction from the user relates to a second application ("SECOND APPLICATION" in step S21).

In step S32, the selection unit 32 selects a first operating parameter OP31 corresponding to the first application from among the plurality of operating parameters stored in the OTP-type ROM 20. The operating parameter OP31 is a parameter that has been predetermined to be more suited to the first application than the initial operating parameters.

In step S33, the selection unit 32 selects a second operating parameter OP32 corresponding to the second application from among the plurality of operating parameters stored in the OTP-type ROM 20. The operating parameter OP32 is a parameter that has been predetermined to be more suited to the second application than the initial operating parameters.

As described above, in the third embodiment, because the operating parameters corresponding to the applications are selected automatically in reaction to what application the content of the change instruction from the user relates to, the operation characteristics of the memory cells can be changed by a simple operation, without requiring sophisticated knowledge of the operating parameter values. That is, from the manufacturer side, it is possible to enter in operating parameters those relating to the expertise, special internal operation or timing and the like, that the manufacturer does not wish to disclose to the user.

Fourth Embodiment

Figure 9:
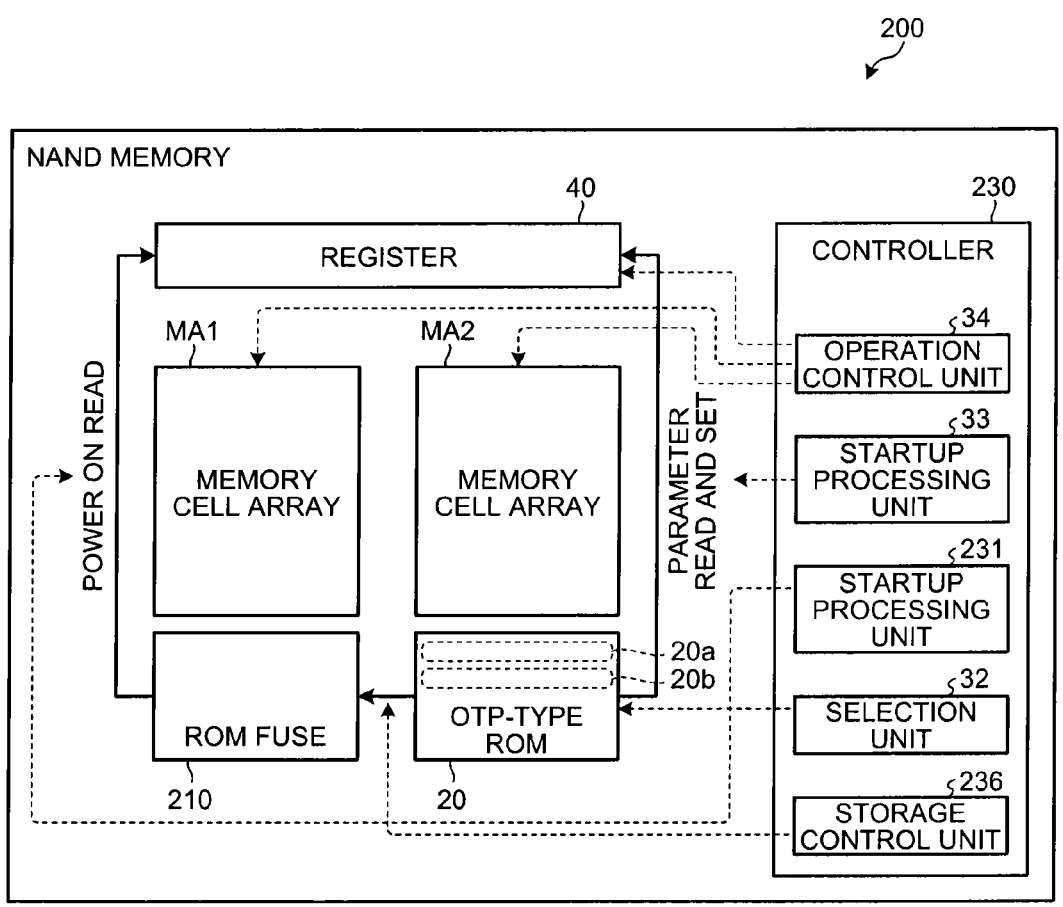
FIG. 9 is a diagram illustrating a configuration of the semiconductor memory device according to a fourth embodiment.

Next, a description is provided for the semiconductor memory device according to the fourth embodiment using FIG. 9. FIG. 9 is a diagram illustrating the configuration of the semiconductor memory device. The description below focuses on those components that differ from the first embodiment.

A NAND memory 200 serving as the semiconductor memory device according to the fourth embodiment includes a controller 230 and an ROM fuse 210. The controller 230 possesses a storage control unit 236 and a startup processing unit 231.

The storage control unit 236 receives from outside (for example, the controller 3 illustrated in FIG. 10) a change command generated in reaction to a change instruction from the user. The storage control unit 236 performs control according to the change command such that the operating parameters selected by the selection unit 32 are read out from the OTP-type ROM 20 and the readout operating parameters in place of the initial operating parameters are stored in the ROM fuse 210. Specifically, the storage control unit 236 reads out the operating parameter by accessing the addresses in the OTP-type ROM 20 retained by the selection unit 32 according to the change command. The storage control unit 236 performs control such that the readout operating parameters are rewritten on the initial operating parameters in the ROM fuse 210. In other words, the storage control unit 236 overwrites and stores the readout operating parameter onto the storage region of the address where the initial operating parameters in the ROM fuse 210 have been stored.

The startup processing unit 231 receives from outside (for example, the controller 3 illustrated in FIG. 10) a power startup command and first readout command generated in reaction to a startup instruction "Power On Read" from the user. The startup processing unit 231 starts up a power circuit (not illustrated) in the NAND memory 200 according to the power startup command. The startup processing unit 231, after recognizing that the startup of the power circuit is completed, reads out the operating parameter described above that has been stored in the ROM fuse 210 according to the first readout command in order to then transfer the same to register 40 for storage. The operating parameter selected by the selection unit 32 and stored in the ROM fuse 210 is thereby set so as to be available for use.

Before the initial operating parameters are rewritten by the storage control unit 236, the ROM fuse 210 copies and backs up the same to addresses separate from the addresses wherein the initial operating parameters have been stored. It is thereby possible to once again return the backed-up initial operating parameters back to the address where they were stored, according to need, after the initial operating parameters have been rewritten by the storage control unit 236.

As described above, in the fourth embodiment, the selected operating parameter is read out from the OTP-type ROM 20 in reaction to the change instruction from the user, and the ROM fuse 210 is rewritten using the readout operating parameter. Further, the above-described selected operating parameter is read out from the ROM fuse 210 in reaction to the startup instruction "Power On Read" from the user in order to then be set so as to be available for use. It is thereby possible to condense and simplify the content of the readout process in comparison to when the operating parameters are read out from the OTP-type ROM 20 and then set so as to be available for use, and therefore the time required for readout process can be shortened.

Next, a description is provided for a memory system 4 using the semiconductor memory devices according to the first through fourth embodiments, using FIG. 10.

A memory system 4 is connected to outside of a host apparatus HA via a communication medium and functions as an external storage medium for the host apparatus HA. The host apparatus HA includes, for example, personal computers or cores based CPU. The memory system 4 includes, for example, SSDs (Solid State Drives) or memory cards. The following is an illustrative example to describe the memory system 4 using the NAND memory 1 as the semiconductor memory device according to the first embodiment.

The memory system 4 includes a controller 3, an ECC (Error Checking and Correction) circuit 2, and a NAND memory 1.

The controller 3 provides overarching control for each constituent element of the memory system 4, and therefore, when an order has been received from the host apparatus HA, control is performed according to the order.

For example, the controller 3, according to the order from the host apparatus HA, controls the programming of data into the NAND memory 1, the reading out of data from the NAND memory 1, the erasure of data in the NAND memory 1 and the like. The controller 3 also manages the number of writes/erasures for the NAND memory 1, and provides the NAND memory 1 with information on the number of writes/erasures as necessary, via the ECC circuit 2.

For example, the controller 3 acts via the ECC circuit 2 to provide the NAND memory 1 with the power startup command and first readout command generated in reaction to a startup instruction "Power On Read" from the user.

For example, the controller 3 acts via the ECC circuit 2 to provide the NAND memory 1 with the power startup command, first readout command and second readout command generated in reaction to a startup instruction "Parameter read and set" from the user.

The ECC circuit 2 performs ECC process for the data that are to be programmed into the NAND memory 1 or for the data that have been read out from the NAND memory 1. The ECC circuit 2 also manages the ECC number (that is, the number of bits handled by ECC process), and provides the NAND memory 1 with information on the ECC number as needed.

Figure 11:
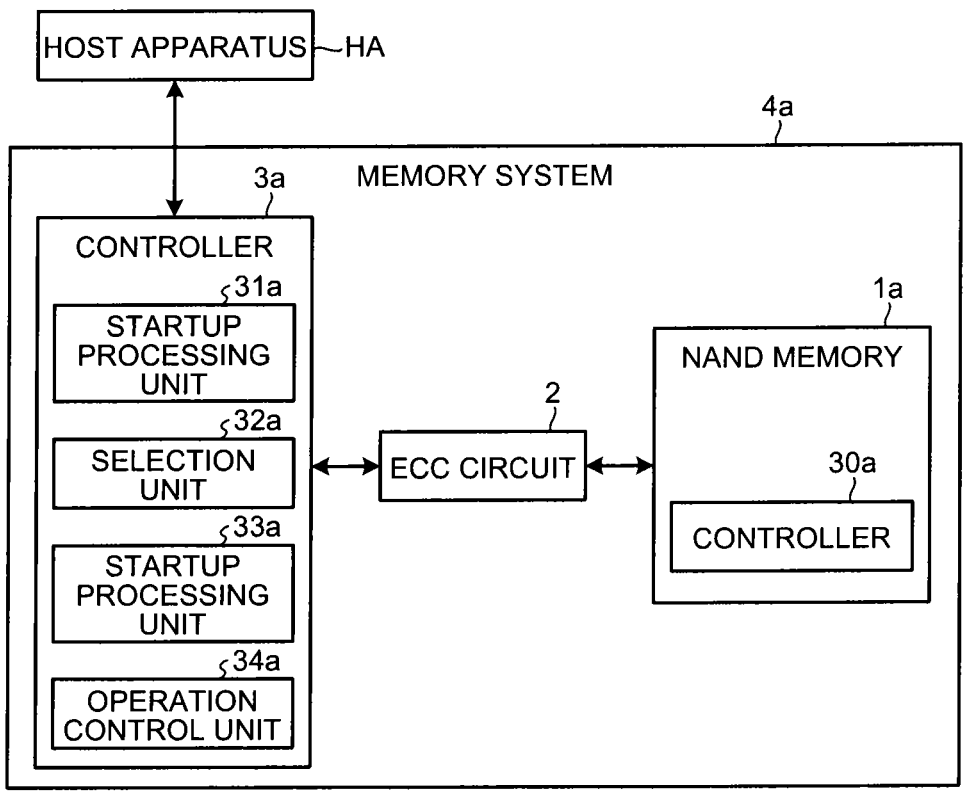
FIG. 11 is a diagram (a modified example) illustrating a configuration of a memory system in which the semiconductor memory devices according to the first through fourth embodiments have been applied.

It is noted that, in a memory system 4a as illustrated in FIG. 11, the startup processing unit 31a, a selection unit 32a, a startup processing unit 33a, and an operation control unit 34a may not be provided for a controller 30a in a NAND memory 1a, or may be provided for a controller 3a. The operational contents of the startup processing unit 31a, the selection unit 32a, the startup processing unit 33a, and the operation control unit 34a are each similar to the operational contents of the startup processing unit 31, the selection unit 32, the startup processing unit 33, and the operation control unit 34, respectively, that are provided in the controller 30 in the NAND memory 1 in the first embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell array which includes memory cells;
   a storage unit which stores a plurality of operating parameters;
   a selection unit which accesses the storage unit and selects a first operating parameter for operating the memory cells from among the plurality of operating parameters stored in the storage unit, based on a first instruction input;
   a startup processing unit which performs a power startup and reads out the first operating parameter from the storage unit and sets the first operating parameter so as to be ready for use, based on a second instruction input; and
   an operation control unit which uses the first operating parameter set by the startup processing unit in order to operate the memory cells.

2. The semiconductor memory device according to claim 1, further comprising a register which stores the first operating parameter, wherein
   the startup processing unit reads out the first operating parameter from the storage unit, and stores the first operating parameter so as to be ready for use in the register.

3. The semiconductor memory device according to claim 1, wherein
   each of the plurality of operating parameters corresponds to each of a plurality of levels showing deterioration over time of a memory cell.

4. The semiconductor memory device according to claim 3, wherein
   the plurality of operating parameters have values shifted from an initial operating parameters corresponding to the plurality of levels.

5. The semiconductor memory device according to claim 1, wherein
   the selection unit determines whether the first instruction relates to a reliability improvement or not, and selects the first operating parameter to be used in order to operate the memory cells from among the plurality of operating parameters depending on the determined result.

6. The semiconductor memory device according to claim 1, wherein
   the selection unit determines whether a number of writes/erasures is equal to or more than a threshold or not, and selects the first operating parameter to be used in order to operate the memory cells from among the plurality of operating parameters depending on the determined result.

7. The semiconductor memory device according to claim 6, wherein
   the selection unit selects, as the first operating parameter, a first specific operating parameter predetermined to improve reliability more than an initial operating parameter when the number of writes/erasures is less than the threshold, and selects, as the first operating parameter, a second specific operating parameter predetermined to improve reliability more than the first specific operating parameter when the number of writes/erasures is equal to or more than the threshold.

8. The semiconductor memory device according to claim 1, further comprising a decision unit which decides an operating mode corresponding to the first instruction from among a plurality of operating modes that include a first operating mode giving priority to reliability and a second operating mode giving priority to performance, wherein
   the selection unit selects the first operating parameter to be used in order to operate the memory cells depending on the operating mode decided upon by the decision unit.

9. The semiconductor memory device according to claim 8, wherein
   the decision unit decides that the operating mode is the first operating mode when the first instruction relates to a reliability improvement, and decides that the operating mode is the second operating mode when the first instruction relates to a performance improvement, and
   the selection unit establishes a threshold value depending on the operating mode decided upon by the decision unit when either the first operating mode or the second operating mode is decided upon by the decision unit, determines whether a number of writes/erasures is equal to or more than the established threshold value, and then selects the first operating parameter to be used in order to operate the memory cells from among the plurality of operating parameters depending on the determined result.

10. The semiconductor memory device according to claim 9, wherein
    the selection unit establishes a first value smaller than a standard value as the threshold value when the first operating mode is decided upon by the decision unit, and establishes a second value greater than the standard value as the threshold value when the second operating mode is decided upon by the decision unit.

11. The semiconductor memory device according to claim 9, wherein
    the selection unit selects, as the first operating parameter, a first specific operating parameter predetermined to improve performance more than an initial operating parameter when the number of writes/erasures is less than the established threshold value, and selects, as the first operating parameter, a second specific operating parameter predetermined to improve reliability more than the initial operating parameter when the number of writes/erasures is equal to or more than the established threshold value.

12. The semiconductor memory device according to claim 10, wherein
    the decision unit decides that the operating mode is a third operating mode when the first instruction relates to raising reliability, depending on the number of writes/erasures, and
    the selection unit establishes the standard value as the threshold value when the third operating mode is decided upon by the decision unit.

13. The semiconductor memory device according to claim 12, wherein
    the selection unit selects, as the first operating parameter, a first specific operating parameter predetermined to improve performance more than an initial operating parameter when the number of writes/erasures is less than the established threshold value, and selects, as the first operating parameter, a second specific operating parameter predetermined to improve reliability more than the initial operating parameter when the number of writes/erasures is equal to or more than the established threshold value.

14. The semiconductor memory device according to claim 10, wherein
the decision unit decides that the operating mode is a fourth operating mode when the first instruction relates to a use of an application, and
the selection unit establishes a third value as the threshold value when the fourth operating mode is decided upon by the decision unit.

15. The semiconductor memory device according to claim 8, wherein
the decision unit decides that the operating mode is a fifth operating mode when the first instruction relates to a reliability request, and
the selection unit establishes a threshold value corresponding to the fifth operating mode when the fifth operating mode is decided upon by the decision unit, determines whether or not a requested number of writes/erasures is equal to or more than the established threshold value, and then selects the first operating parameter to be used in order to operate the memory cells from among the plurality of operating parameters depending on the determined result.

16. The semiconductor memory device according to claim 15, wherein
the selection unit establishes a second threshold value corresponding to the fifth operating mode when the fifth operating mode is decided upon by the decision unit, determines whether or not a number of bits handled by ECC process is equal to or more than the established second threshold value, and then selects the first operating parameter to be used to operate the memory cells from among the plurality of operating parameters depending on the determined result for the requested number of writes/erasures and the determined result for the number of bits handled by ECC process.

17. The semiconductor memory device according to claim 1, wherein
the storage unit is an OTP (One Time Programmable)-type ROM region arranged on a periphery of the memory cell array.

18. The semiconductor memory device according to claim 1, wherein
the selection unit determines what application the first instruction relates to, and then selects the first operate parameter to be used in order to operate the memory cells from among the plurality of operating parameters depending on the determined result.

19. The semiconductor memory device according to claim 1, further comprising:
a second storage unit which stores an initial operating parameter;
a storage control unit which performs a control according to the first instruction such that the first operating parameter selected by the selection unit is read out from the storage unit and the readout parameter are stored in place of the initial operating parameter in the second storage unit; and
a second startup processing unit which reads out the first operating parameter selected by the selection unit from the second storage unit and sets the operating parameter so as to be available for use, depending on a third instruction.

* * * * *